(12) United States Patent
Tanaka et al.

(10) Patent No.: US 9,331,733 B2
(45) Date of Patent: May 3, 2016

(54) WIRELESS COMMUNICATION TERMINAL DEVICE

(71) Applicant: KYOCERA Corporation, Kyoto (JP)

(72) Inventors: Junji Tanaka, Shijonawate (JP); Katsushige Koori, Osaka (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 14/653,810

(22) PCT Filed: Dec. 16, 2013

(86) PCT No.: PCT/JP2013/083630
§ 371 (c)(1),
(2) Date: Jun. 18, 2015

(87) PCT Pub. No.: WO2014/098030
PCT Pub. Date: Jun. 26, 2014

(65) Prior Publication Data
US 2015/0326267 A1 Nov. 12, 2015

(30) Foreign Application Priority Data

Dec. 18, 2012 (JP) .................................. 2012-275661

(51) Int. Cl.
*H04M 1/00* (2006.01)
*H04B 1/3888* (2015.01)
(Continued)

(52) U.S. Cl.
CPC ............ *H04B 1/3888* (2013.01); *H01Q 1/243* (2013.01); *H01Q 7/00* (2013.01); *H04M 1/026* (2013.01); *H05K 5/0004* (2013.01); *H05K 5/0247* (2013.01)

(58) Field of Classification Search
CPC ............. H01Q 1/24; H01Q 7/00; H04M 1/02; H05K 9/00

USPC ........................ 455/575.1, 550.1, 90.3, 575.8
See application file for complete search history.

(56) References Cited

U.S. PATENT DOCUMENTS

| | | | |
|---|---|---|---|
| 7,123,886 B2 * | 10/2006 | Morita ................. | H01M 2/1066 379/114.15 |
| 7,136,681 B2 * | 11/2006 | Sadler .................. | H04B 1/3838 455/556.1 |
| 2006/0172760 A1 * | 8/2006 | Toyama .................. | H04N 5/44 455/550.1 |

FOREIGN PATENT DOCUMENTS

| | | |
|---|---|---|
| JP | 2003-234668 A | 8/2003 |
| JP | 2007-189628 A | 7/2007 |
| JP | 2011-044778 A | 3/2011 |

OTHER PUBLICATIONS

International Search Report dated Mar. 11, 2014 issued in counterpart International Application No. PCT/JP2013/083630.
Written Opinion of the International Searching Authority issued by Japan Patent Office for International Application No. PCT/JP2013/083630.

* cited by examiner

*Primary Examiner* — Sonny Trinh
(74) *Attorney, Agent, or Firm* — Procopio, Cory, Hargreaves & Savitch LLP

(57) ABSTRACT

A wireless communication terminal device according to the present invention comprises a main body which has a built-in electronic component, a casing which houses the main body, a cover body which is detachably attached to the casing, an antenna for wireless communication which is mounted on the cover body, a pair of electrodes which are disposed on the inner face of the cover body and connected to the antenna, a pair of terminals which are disposed on the main body and make contact with the pair of electrodes, and at least two projection pieces which are formed on the inner face of the cover body near the pair of electrodes as well as on both sides with the pair of electrodes interposed therebetween and project higher than the surfaces of the pair of electrodes.

2 Claims, 7 Drawing Sheets

(51) Int. Cl.
*H05K 5/00* (2006.01)
*H05K 5/02* (2006.01)
*H01Q 7/00* (2006.01)
*H01Q 1/24* (2006.01)
*H04M 1/02* (2006.01)

F I G. 4
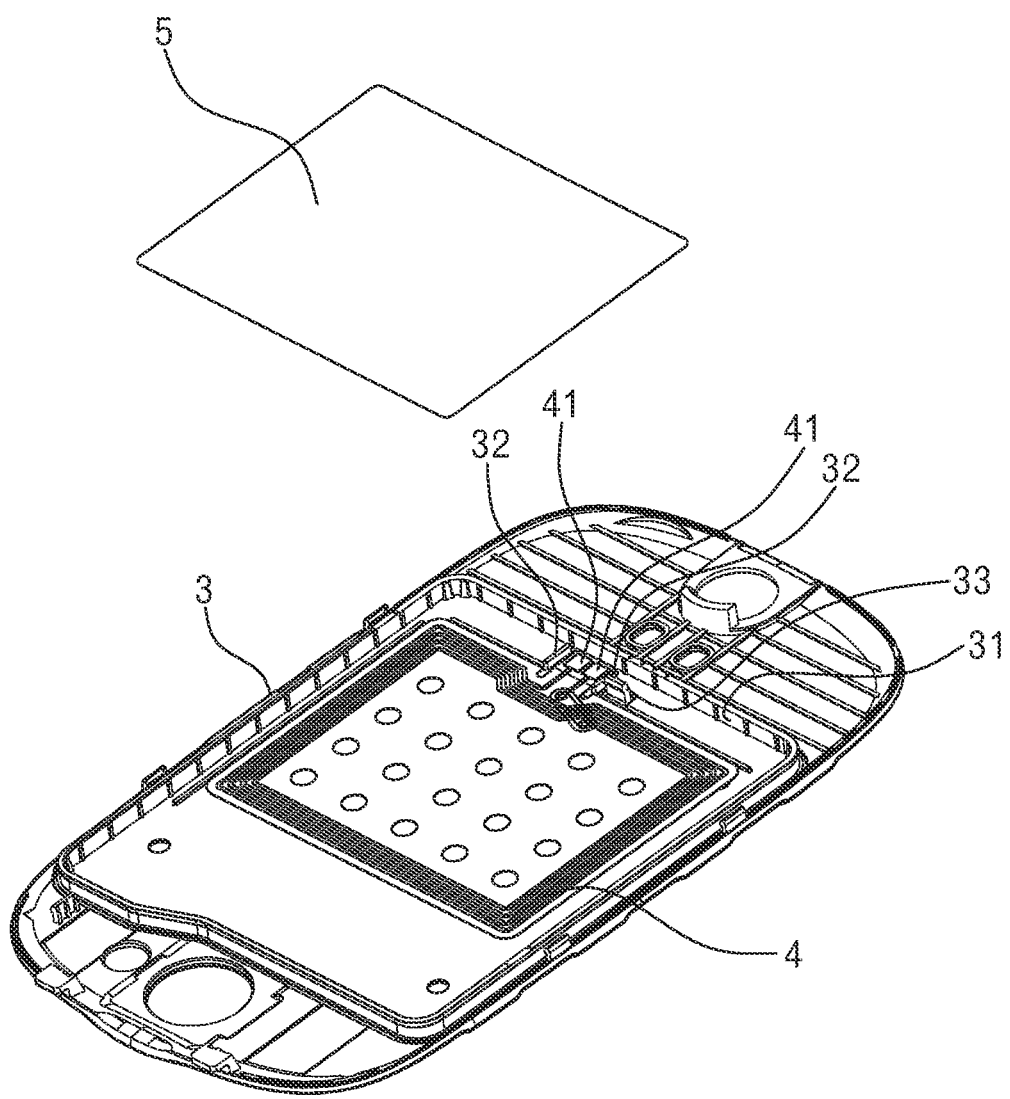

ENLARGED PART A

ENLARGED PART B

WIRELESS COMMUNICATION TERMINAL DEVICE

TECHNICAL FIELD

The present invention relates to a wireless communication terminal device which includes a casing, a cover body detachably attached to the casing, and an antenna for wireless communication mounted on the cover body.

BACKGROUND ART

In recent years, in order to achieve an electronic money function, an antenna for short range wireless communication may be installed in a mobile phone in addition to an antenna for telephone communication.

For example, an antenna for short range wireless communication is mounted on a cover body which covers a battery chamber of a main body having a built-in electronic component. A pair of electrodes connected to the antenna is disposed on the inner face of the cover body. On the other hand, a pair of terminals to make contact with the pair of electrodes is disposed on the main body.

In the mobile phone, attaching the cover body to a casing brings the pair of electrodes of the cover body into contact with the pair of terminals of the main body. Accordingly, the antenna is connected to an electronic circuit of the main body to work.

However, the following problem may occur in the above mobile phone. When the cover body is detached for, for example, battery replacement, a finger may touch the pair of electrodes exposed on the inner face of the cover body. Accordingly, sebum or salt of the finger may be adhered to the electrodes to cause corrosion of the electrodes, which may result in contact failure between the electrodes and the terminals.

Therefore, there has been demanded a wireless communication terminal device capable of controlling corrosion of a pair of electrodes disposed on the inner face of a casing with a simple configuration.

SUMMARY OF THE INVENTION

A wireless communication terminal device according to the present invention comprises a main body which has a built-in electronic component, a casing which houses the main body, a cover body which is detachably attached to the casing, an antenna for wireless communication which is mounted on the cover body, a pair of electrodes which are disposed on the inner face of the cover body and connected to the antenna, a pair of terminals which are disposed on the main body and make contact with the pair of electrodes, and at least two projection pieces which are formed on the inner face of the cover body near the pair of electrodes as well as on both sides with the pair of electrodes interposed therebetween and project higher than the surfaces of the pair of electrodes.

BRIEF DESCRIPTION OF THE DRAWINGS

FIG. 4 is a perspective view illustrating a state in which a radio wave blocking sheet is peeled off from the inner face of the cover body.

DETAILED DESCRIPTION OF EMBODIMENT

Hereinbelow, an embodiment in which the present invention is embodied as a mobile phone will be specifically described with reference to the drawings.

Figure 1:
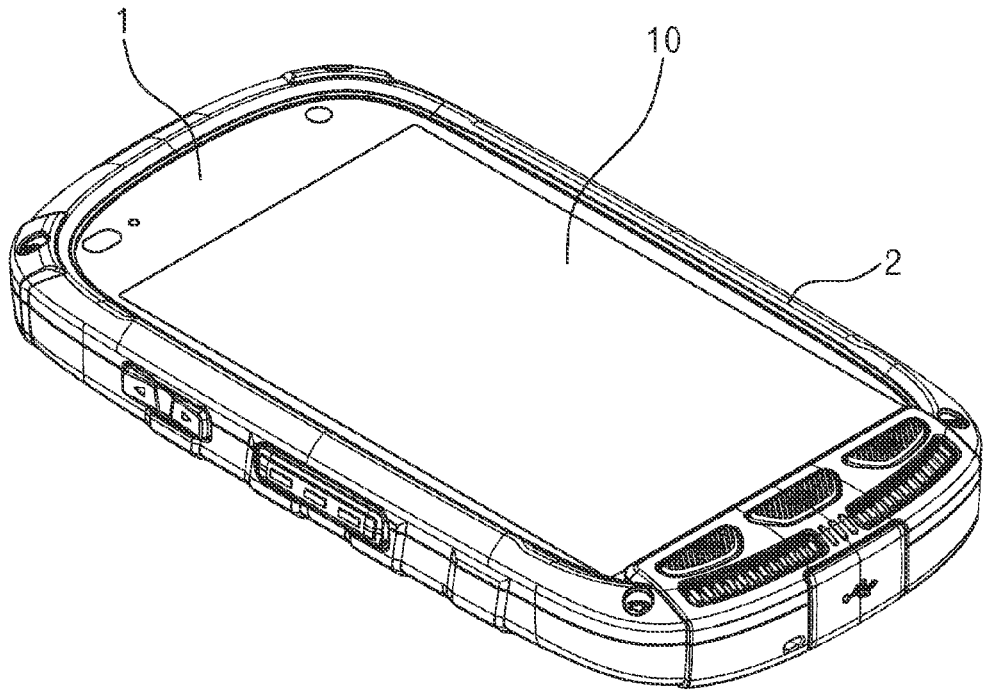
FIG. 1 is a perspective view of a mobile phone which is an embodiment of the present invention.
Figure 2:
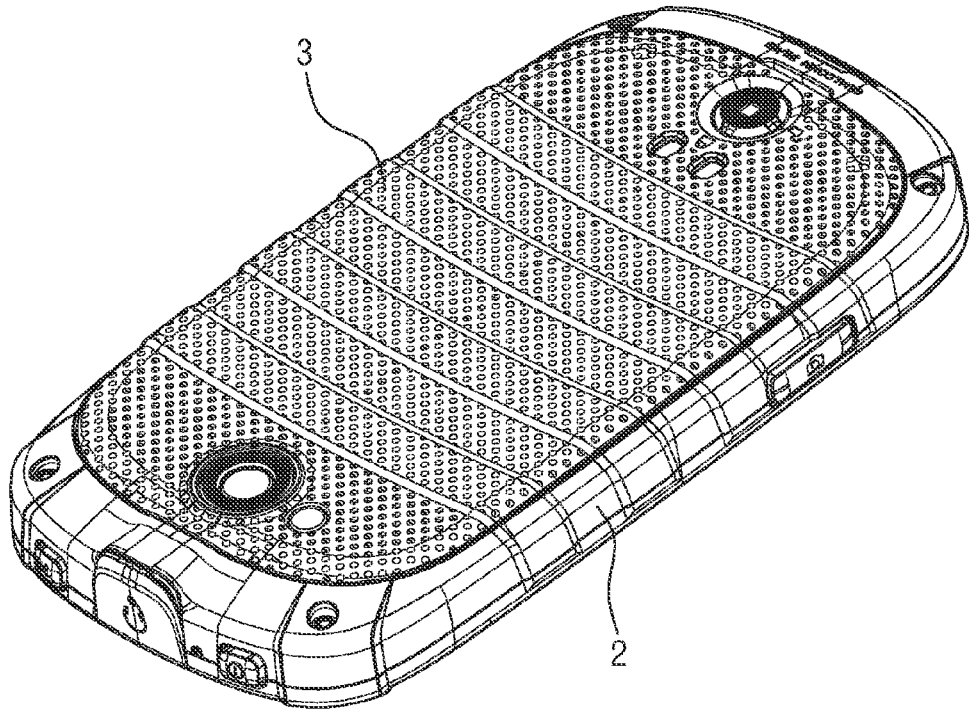
FIG. 2 is a perspective view illustrating the back face of the mobile phone.

As illustrated in FIGS. 1 and 2, a mobile phone as an embodiment of the present invention comprises a main body 1 which includes a display 10 and an electronic circuit such as a telephone communication circuit both built therein, a synthetic resin casing 2 which houses the main body 1, and a synthetic resin cover body 3 which is detachably attached to the back face of the main body 1.

Figure 5:
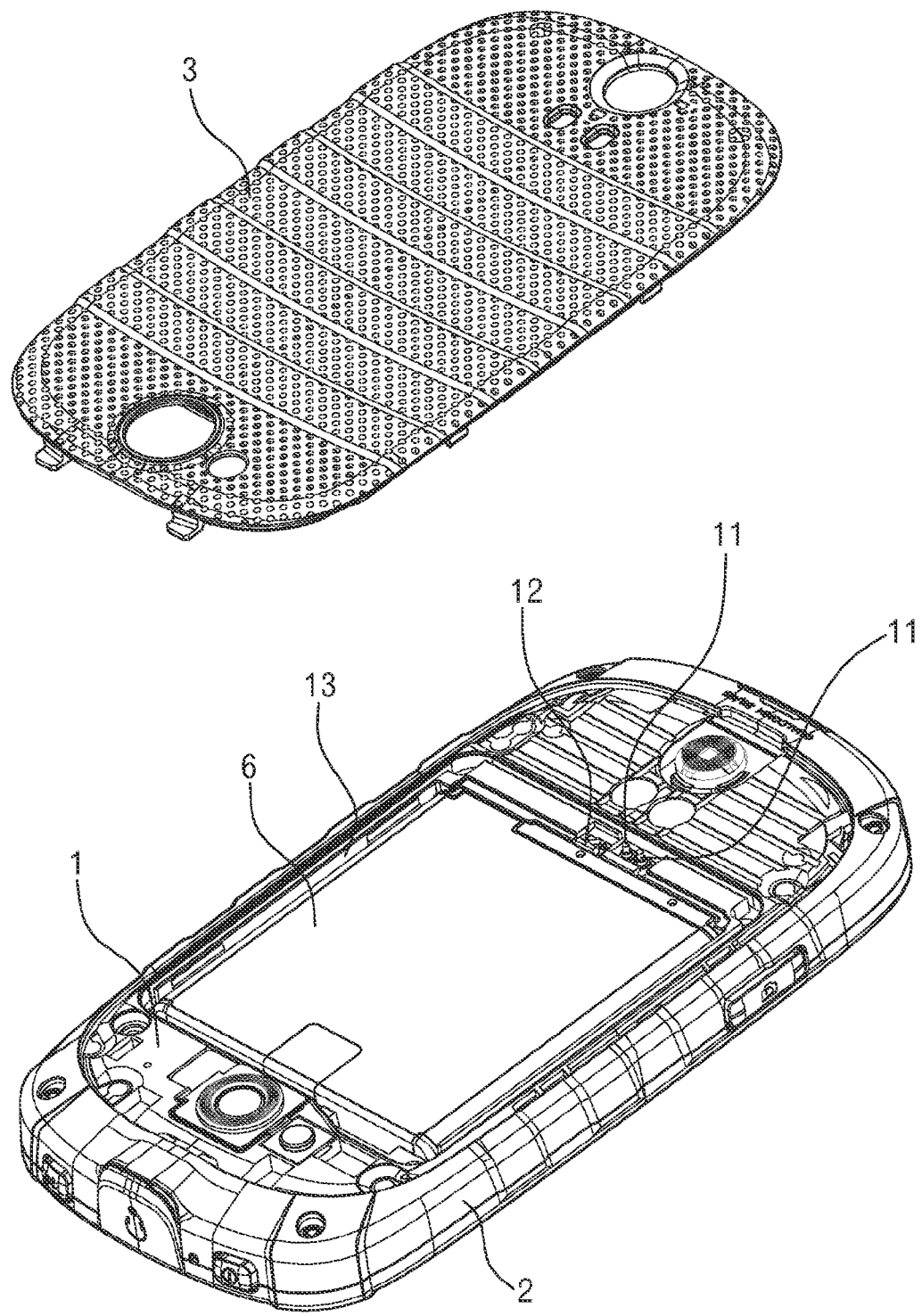
FIG. 5 is a perspective view illustrating a state in which the main body is turned over and the cover body is detached from the main body.

As illustrated in FIG. 5, a battery housing chamber 13 is recessed on the back face of the main body 1. A battery 6 which serves as a power source is housed in the battery housing chamber 13.

The casing 2 has a known waterproof structure using an O-ring.

Figure 11:
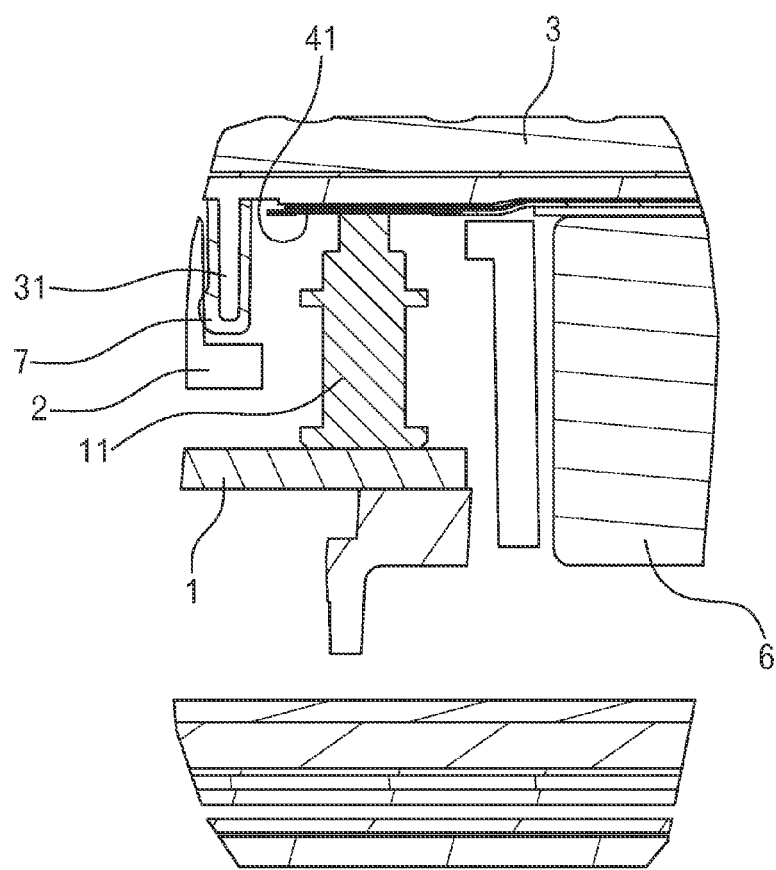
FIG. 11 is an enlarged cross-sectional view of a part B of FIG. 10.

As illustrated in FIG. 4, a rib 31 projects from the inner face of the cover body 3 and extends to surround the battery chamber 13. As illustrated in FIG. 11, a waterproof packing 7 having a U-shaped cross section is attached to the rib 31. Thus, attaching the cover body 3 to the casing 2 brings the waterproof packing 7 into close contact with the surface of the main body 1 to seal a space including the battery housing chamber 13. Accordingly, waterproofing for the space can be achieved.

As illustrated in FIG. 4, an antenna 4 for short range wireless communication is formed in a loop form on the inner face of the cover body 3. In addition, a pair of electrodes 41, 41 connected to the antenna 4 are disposed side by side on the right and left near the antenna 4. These electrodes 41, 41 are formed by gold plating.

Figure 3:
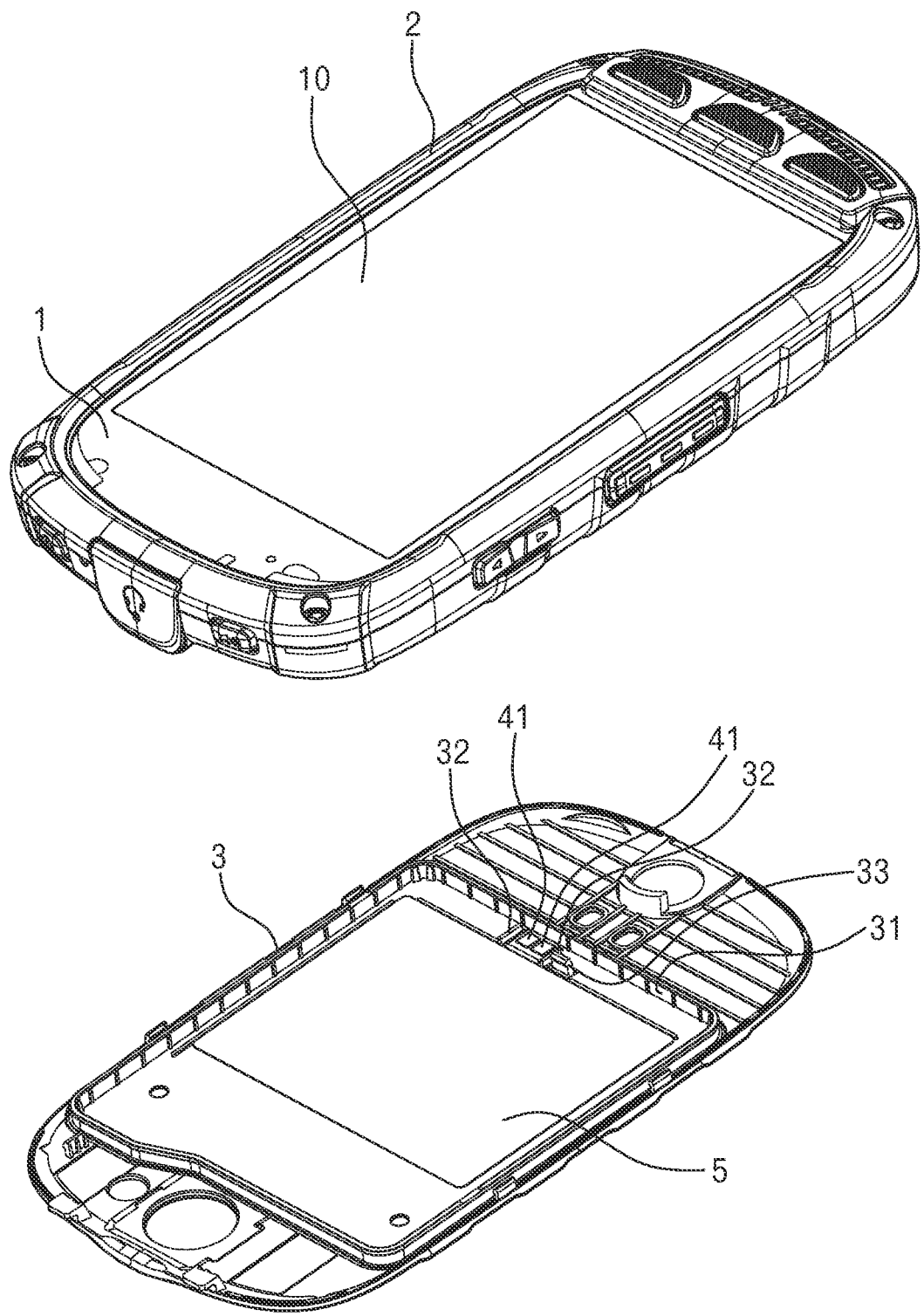
FIG. 3 is a perspective view illustrating a state in which a cover body is detached from a main body.

As illustrated in FIG. 3, the antenna 4 formed on the inner face of the cover body 3 is covered with a radio wave blocking sheet 5 which is stuck to the inner face of the cover body 3. According to this structure, the radio wave emitted from the main body 1 does not adversely affect the performance of the antenna 4.

Figure 7:
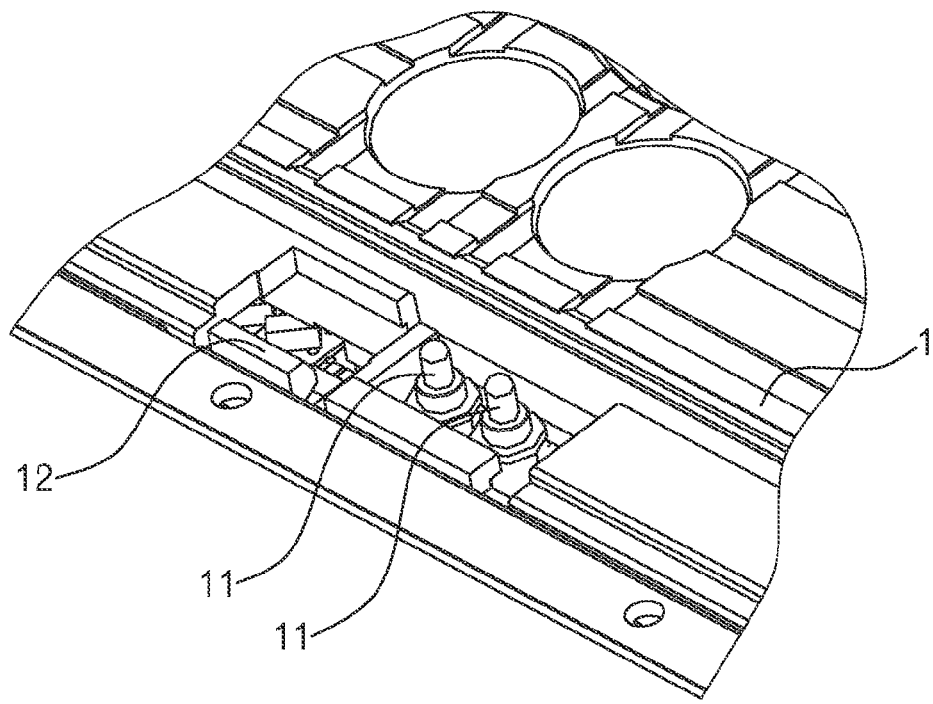
FIG. 7 is an enlarged perspective view of a principal part of the main body.
Figure 8:
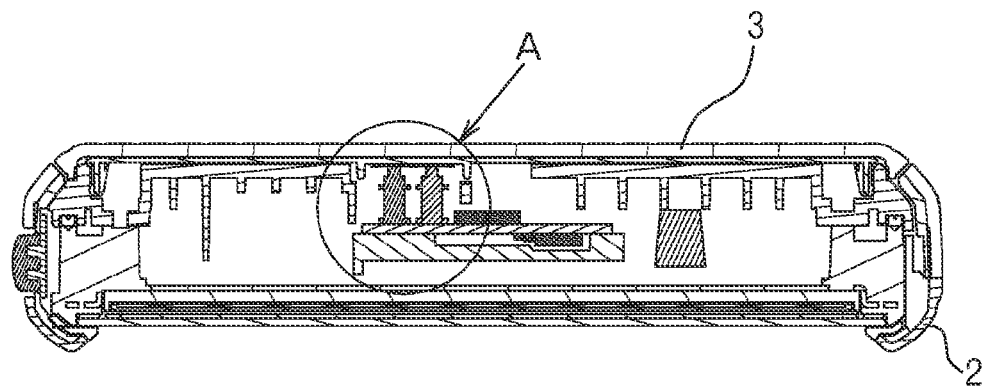
FIG. 8 is a lateral cross-sectional view of the mobile phone.
Figure 9:
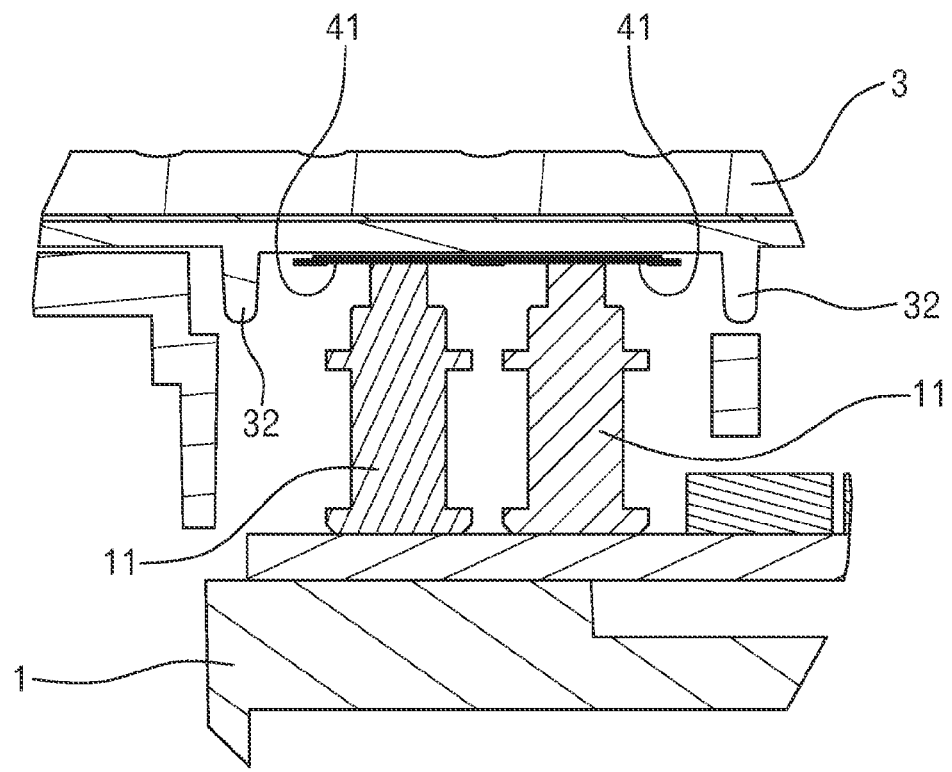
FIG. 9 is an enlarged cross-sectional view of a part A of FIG. 8.
Figure 10:
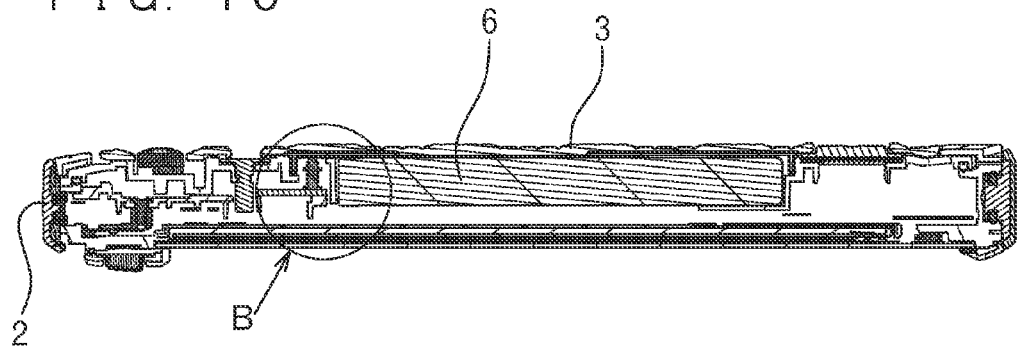
FIG. 10 is a longitudinal cross-sectional view of the mobile phone.

On the other hand, as illustrated in FIGS. 5 and 7, a pair of terminals 11, 11 project from the main body 1. Attaching the cover body 3 to the casing 2 allows the tip of each of the terminals 11 to be pressed against the surface of each of the electrodes 41 as illustrated in FIGS. 8 to 11. As a result, the antenna 4 is connected to the electronic circuit (not illustrated) built in the main body 1.

As illustrated in FIGS. 3 and 4, a hook piece 33 projects from the inner face of the cover body 3 at a position near the electrodes 41. As illustrated in FIG. 5, a hook receiving piece 12 projects from the back face of the main body 1 at a position near the terminals 11. Attaching the cover body 3 to the casing 2 allows the hook piece 33 to be engaged with the hook receiving piece 12 to stably maintain the pressure-contact state between the terminals 11 and the electrodes 41.

Figure 6:
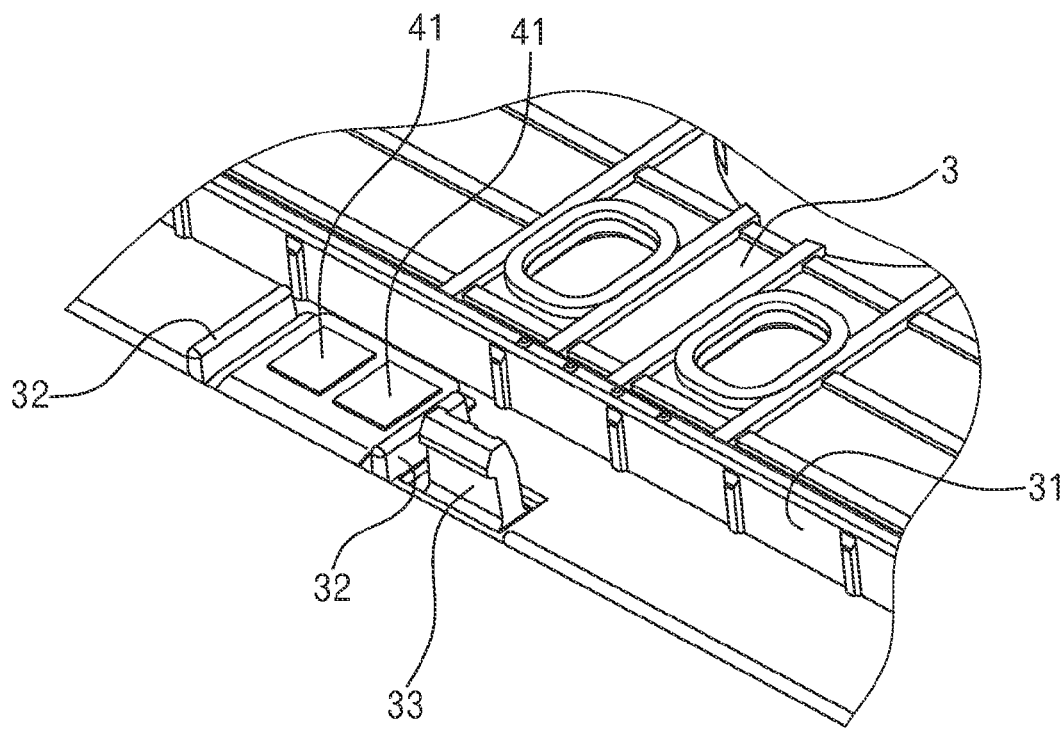
FIG. 6 is an enlarged perspective view of a principal part of the cover body.

As illustrated in FIGS. 4 and 6, a pair of projection pieces 32, 32 is formed by integral molding on the inner face of the cover body 3. The projection pieces 32, 32 are located near the pair of electrodes 41, 41 as well as on the right and left sides with the electrodes 41, 41 interposed therebetween. The projection pieces 32, 32 project higher than the surfaces of the electrodes 41, 41. The distance between the projection pieces 32, 32 is smaller than the thickness of the finger and the length of each of the projection pieces 32, 32 in a direction along the electrodes 41, 41 is longer than the length of each of the electrodes 41, 41.

A clearance is formed on the main body 1 so as not to cause the projection pieces 32, 32 of the cover body 3 to interfere the main body 1 with the cover body 3 attached to the casing 2.

In the above mobile phone, as illustrated in FIG. 3, the two projection pieces 32, 32 are formed on the right and left sides of the pair of electrodes 41, 41. Thus, even when the finger comes close to the pair of electrodes 41, 41 exposed on the inner face of the cover body 3 with the cover body 3 detached from the casing 2, the finger touches the tips of the two projection pieces 32, 32 which are higher than the surfaces of the electrodes 41, 41 to avoid to contact between the finger and the electrodes 41, 41. Accordingly, corrosion of the electrodes 41, 41 is reduced.

The hook piece 33 which projects higher than the projection pieces 32 is formed beside the pair of electrodes 41, 41. Further, the rib 31 extends along the electrodes 41, 41 at the position near the electrodes 41, 41. Thus, the hook piece 33 and the rib 31 also exhibit a function of keeping the finger off the electrodes 41, 41.

Further, in the above mobile phone, the two projection pieces 32, 32 are formed in a rib-like shape extending in a direction approaching the antenna 4, and the radio wave blocking sheet 5 is stuck to the inner face of the cover body 3 with the edge of the radio wave blocking sheet 5 abutting on the lateral ends of the projection pieces 32, 32.

This configuration facilitates positioning of the radio wave blocking sheet 5 when the radio wave blocking sheet 5 is stuck to the inner face of the cove body 3 in an assembling process.

The configurations of the respective members of the present invention are not limited to the above embodiment. A person skilled in the art may make various modifications without departing from the spirit of the invention described in the claims. For example, the number of the projection pieces 32, 32 is not limited to two, and three or more projections 32 may be disposed to surround the electrodes 41, 41. Further, the antenna 4 is not limited to an antenna for short range wireless communication, and may be other known antennas.

DESCRIPTION OF REFERENCE CHARACTERS 1 main body
11 terminal
2 casing
3 cover body
31 rib
32 projection piece
33 hook piece
4 antenna
41 electrode
5 radio wave blocking sheet

The invention claimed is:
1. A wireless communication terminal device comprising:
a main body having a built-in electronic component;
a casing housing the main body;
a cover body detachably attached to the casing;
an antenna for wireless communication mounted on the cover body;
a pair of electrodes disposed on an inner face of the cover body and connected to the antenna;
a pair of terminals disposed on the main body, the pair of terminals making contact with the pair of electrodes; and
at least two projection pieces formed on the inner face of the cover body near the pair of electrodes as well as on both sides with the pair of electrodes interposed therebetween, the at least two projection pieces projecting higher than surfaces of the pair of electrodes.
2. The wireless communication terminal device according to claim 1, wherein
the antenna is an antenna for short range wireless communication disposed on the inner face of the cover body,
the antenna is covered with a radio wave blocking sheet stuck to the inner face of the cover body, and
an edge of the radio wave blocking sheet abuts on the at least two projection pieces.

* * * * *